US006625038B2

(12) United States Patent
Raschke

(10) Patent No.: US 6,625,038 B2
(45) Date of Patent: Sep. 23, 2003

(54) FUNCTIONAL ASYMMETRICAL CIRCUIT SUBSTRATE ASSEMBLY INCLUDING A MIRROR-SYMMETRICAL COMPONENT LAYOUT

(75) Inventor: Dirk Raschke, Auerbach (DE)

(73) Assignee: Cherry GmbH, Auerbach (DE)

( * ) Notice: Subject to any disclaimer, the term of this patent is extended or adjusted under 35 U.S.C. 154(b) by 83 days.

(21) Appl. No.: 09/917,430

(22) Filed: Jul. 27, 2001

(65) Prior Publication Data

US 2002/0071263 A1 Jun. 13, 2002

(30) Foreign Application Priority Data

Aug. 7, 2000 (DE) .......................... 100 38 390

(51) Int. Cl.$^7$ ................................. H05K 7/06
(52) U.S. Cl. .................. 361/784; 361/777; 361/781; 361/791; 361/803
(58) Field of Search ................ 361/736, 737, 361/777, 784, 803, 781, 791; 307/9.1, 10.1, 147; 180/321–323; 200/5 R

(56) References Cited

U.S. PATENT DOCUMENTS 5,128,500 A * 7/1992 Hirschfeld .................. 200/5 R
5,612,577 A 3/1997 Schmidt et al. ............ 307/10.1

FOREIGN PATENT DOCUMENTS

| DE | 39 04 771 C1 | 6/1990 |
| DE | 42 38 867 A1 | 5/1994 |
| DE | 44 05 566 A1 | 8/1995 |
| DE | 44 29 983 A1 | 11/1995 |
| DE | 198 44 333 C | 9/1999 |

* cited by examiner

Primary Examiner—John B. Vigushin
(74) Attorney, Agent, or Firm—Chernoff Vilhauer McClung & Stenzel, LLP

(57) ABSTRACT

The invention relates to a circuit substrate assembly comprising a left-hand (1) and a right-hand (1') circuit substrate mirror-symmetrical thereto, each including electrical and/or electronic and/or electromechanical components (2–6 or 2'–6') and circuitry (7 or 7') electrical connecting said components. All components (2–6) are positioned symmetrically mirrored on the left-hand (1) and right-hand (1') circuit substrate respectively when the left-hand (1) and right-hand (1') circuit substrate is oriented mirror-symmetrical along a mirror plane (P). However, the circuit functional plug assignments (A–F) of at least one circuit functional mirror-invariant component 2 or 2' on the left-hand (1) and on the right-hand (1') circuit substrate are not mirror-symmetrical to each other. This assembly is suitable for use in applications in which a mirror-symmetrical assembly of the circuit substrates (2, 2') in a three-dimensional geometry is desired, without requiring the components on the right-hand circuit substrate to be mirror-symmetrical to the components on the left-hand circuit substrate.

11 Claims, 5 Drawing Sheets

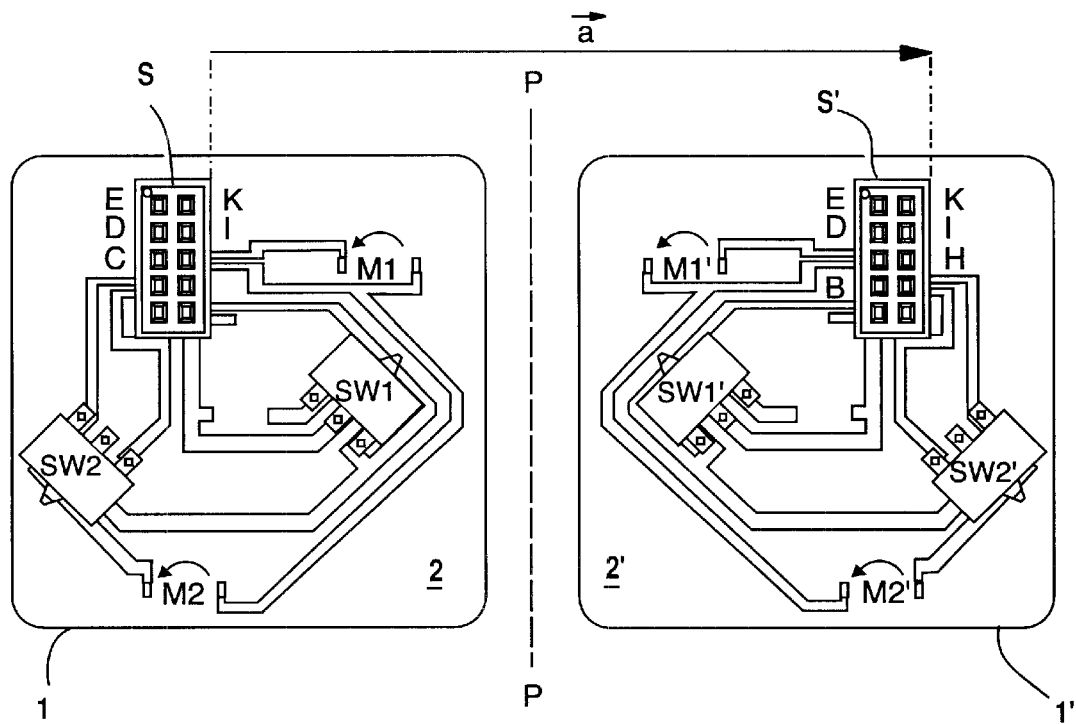
Fig. 1a  Fig. 1b
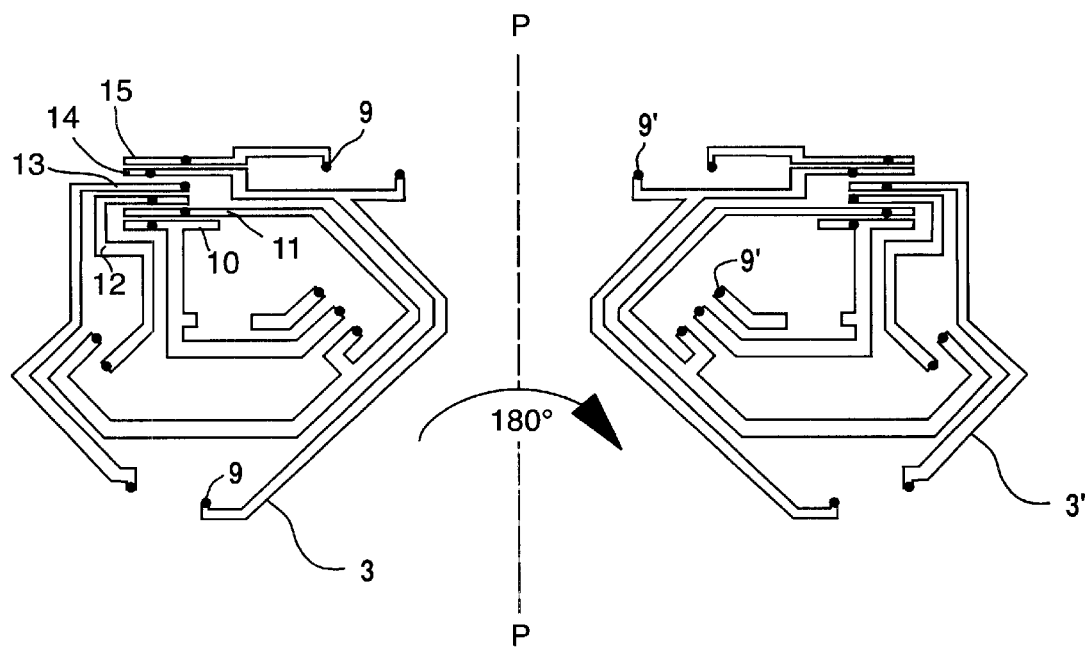
Fig. 2a  Fig. 2b

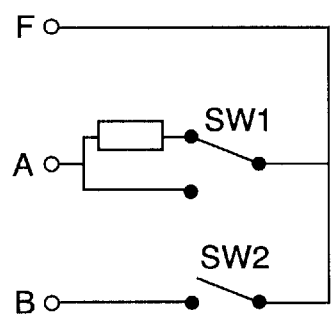
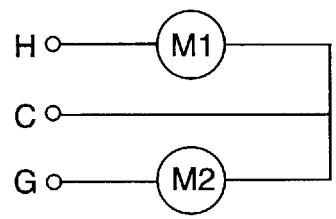
Fig. 4
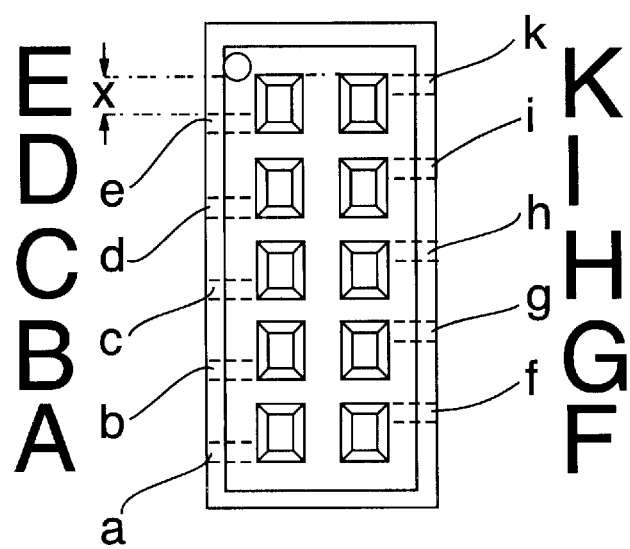
Fig. 7

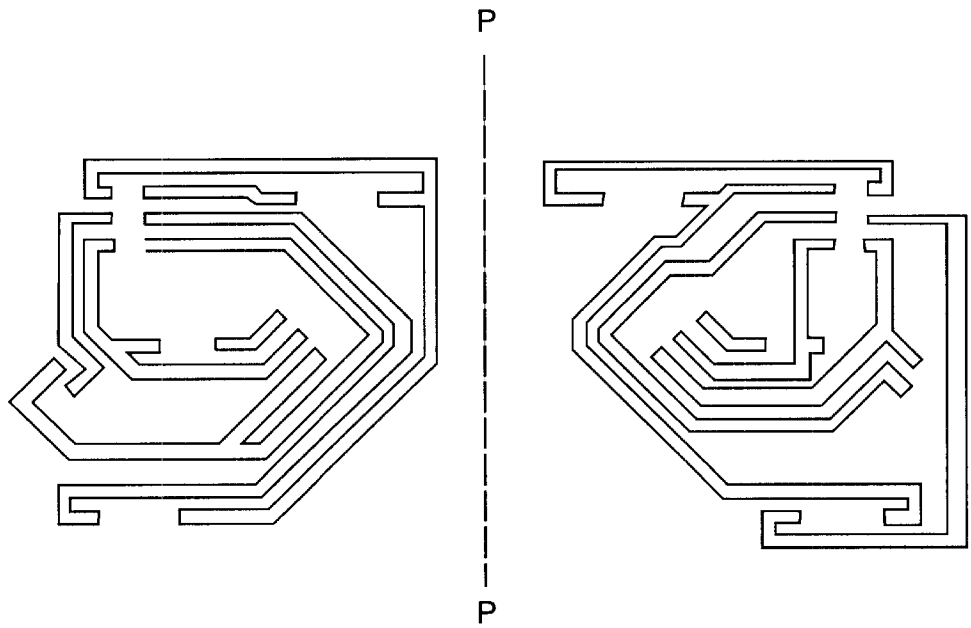
Fig. 5a  Fig. 5b
Prior art
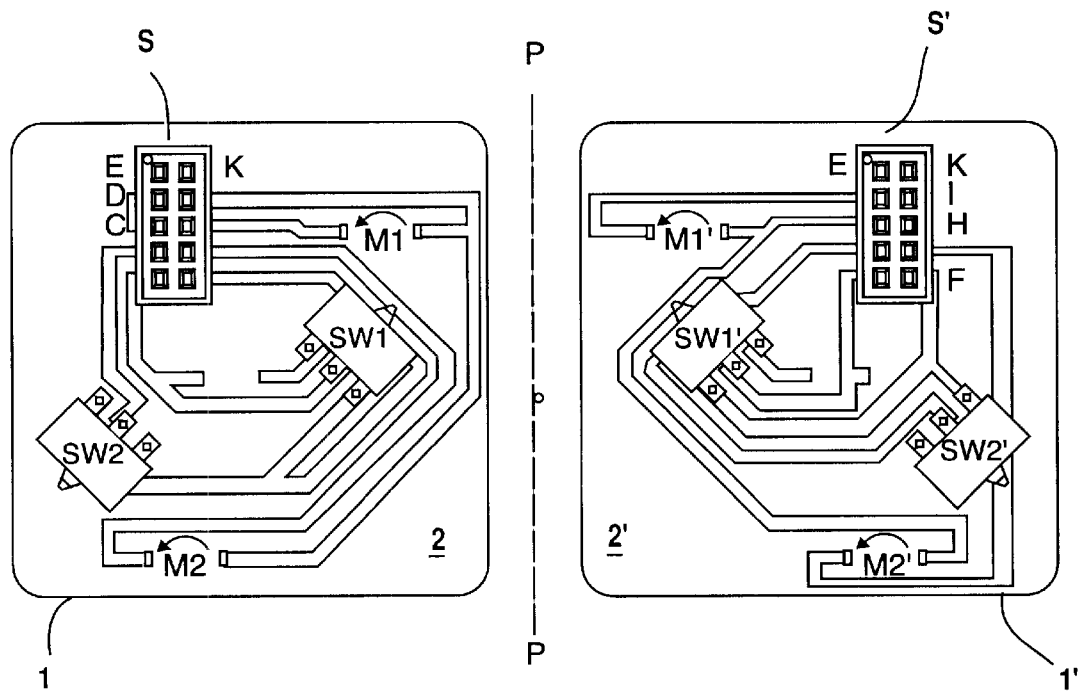
Fig. 6a  Fig. 6b
Prior art

FUNCTIONAL ASYMMETRICAL CIRCUIT SUBSTRATE ASSEMBLY INCLUDING A MIRROR-SYMMETRICAL COMPONENT LAYOUT

RELATED APPLICATIONS

This application claims priority of a prior German application Serial No. 100 38 390.4-34 filed Aug. 7, 2000.

FIELD OF THE INVENTION

The present invention relates to a circuit substrate assembly comprising pairs of "left-hand" and "right-hand" circuit substrates including electrical and/or electronic and/or electromechanical components positioned mirror-symmetrical to each other, it relating more particularly to circuit substrate assemblies as set forth in the preamble of claim 1 as known from DE 39 04 771 C1, DE 44 05 566 A1 and U.S. Pat. No. 5,612,777 in each case.

BACKGROUND OF THE INVENTION

The objective forming the basis of the present invention is explained, by way of an example, with reference to FIGS. 3a to 6b.

For controlling car door locks, use is made nowadays of electromechanical locking devices. Shown diagrammatically in FIGS. 3a or 3b is a plan view of the open pans 1, 1' of a circuit substrate 2, 2' for a left-hand and right-hand car door respectively.

The circuit substrates 2, 2' are plastics substrate parts in which electric conductors are embedded which connect the electrical and/or electronic and/or electromechanical components to each other on the two circuit substrates 2, 2'.

In FIGS. 3a and 3b the components applied to the two circuit substrates 2 or 2' are, for example, a first switch SW1 or SW1', a second switch SW2 or SW2', a first electric motor M1 or M1', a second electric motor M2 or M2' and a plug S or S'. The electric motors are each symbolized by the contact terminals and the direction of rotation of the motor.

In series automobile production the situation calls for configuring the two circuit substrates 2, 2' and their pans 1, 1' as shown in FIGS. 3a and 3b for a left-hand and right-hand car door mirror-symmetrical to permit installing them on both sides of the motor vehicle positioned and oriented mirror-symmetrical to each other.

When imagining that a mirror plane P is oriented between the left-hand and right-hand variants of a circuit substrates 2, 2' as shown in FIGS. 3a and 3b, then due to the symmetry requirements the positions and orientations of the components mounted on the left-hand circuit substrate 2 are mirror-symmetrical to the positions and orientations of the components mounted on the right-hand circuit substrate 2'.

It is particularly in series motor vehicle production that for reasons of simplifying material economy and cost savings in designing the variants there exists the marginal requirement that the number of component variants to be developed and held available is to be minimized. This means, for example, that no specific left-hand and specific right-hand variant is to be provided in each case for the components as shown in FIGS. 3a and 3b. By making use of only one variant of components the complexity requirements in installation and on the corresponding automated handling devices are also reduced in each case.

Instead, what is desired in series production is that the motors M1 and M2, the switches SW1 and SW2 and plug S as shown in FIG. 3a and all totally identical to the motors M1' or M2', the switches SW1' and SW2' and plug S' as shown in FIG. 3b.

Accordingly, as regards their circuit-functional contact assignment and effectiveness, the components as shown in FIGS. 3a and 3b are not mirror-symmetrical to each other, i.e. the identical motors M1 in FIG. 3a and M1' in FIG. 3b both rotate counter-clockwise, for example (and not opposite in rotation to each other) and the plug positions plug positions A–K of the plugs S or S' as shown in FIGS. 3a and 3b are likewise not mirror-symmetrical to each other, they instead corresponding to each other.

In other words, mirror-symmetry exists as regards the three-dimensional geometry of the installation situation for the left-hand and the right-hand variant of the circuit substrate, whereas asymmetry exists as regards the functionality of the circuit.

Due to the components being identical as shown in left-hand and right-hand configuration this also results in, in the case of car door locking devices, that for the mating the plugs and the wiring harnesses connected thereto a left-hand and right-hand variant does not need to be provided in each case, but instead only an identical variant to be installed on the left-hand and right-hand side of the vehicle as regards its symmetrical positioning and orientation in a three-dimensional geometry, but which is asymmetrical as regards its circuit functionality.

Since both circuit substrates as shown in FIGS. 3a and 3b are assigned exactly the same circuit diagram and the same contact pin assignment, as shown in FIG. 4 for example, two different layouts for the circuitry need to be designed for the circuitry in the left-hand and right-hand embodiment of the circuit substrates 2, 2' for correctly contacting the left-hand and right-hand variant of the circuit substrates 2, 2' in accordance with the circuit function.

Satisfying this requirement hitherto in actual practice was achieved by selecting a layout for the left-hand circuit substrates 2 different to that for the right-hand circuit substrates 2', as evident from FIGS. 5a and 5b each showing a layout for a left-hand and a right-hand circuitry.

Referring now to FIGS. 6a and 6b there is illustrated, the same as shown in FIGS. 3a and 3b, how the circuitry as shown in FIGS. 5a and 5b is embedded in the circuit substrates 2, 2' which is usually done by potting the circuit substrates in plastics.

When using e.g. a stamped matrix for the circuitry, then the layouts as shown in FIGS. 5a and 5b correspond to two different stamped matrixes, each of which is to be embedded in the left-hand and right-hand circuit substrates 2, 2' respectively, this requiring, of course, two different stamping/bending dies for producing the stamped matrixes. In automated production this results in two production lanes totally separate from each other needing to be equipped including stamping/bending dies and automated handling devices each specifically adapted to the left-hand and right-hand stamped matrix. By making use of different stamping/bending dies for the left-hand and right-hand stamped matrix it is possible to configure on the two stamped matrixes, by suitably bending the free-standing stamped matrix sections, contact pins (not shown) permitting contacting the components to the two stamped matrixes as shown in FIGS. 6a and 6b such that the components are positioned mirror-symmetrical to each other on the left-hand and right-hand stamped matrix.

Similar problems are likewise involved when using circuit substrates with applied track arrays, e.g. in the form of of rigid circuit boards or flexible printed circuit films instead of stamped matrixes. Here too, two variants having different circuitry (layouts) needs to be provided for the left-hand and right-hand embodiment in the case of such circuit substrates provided with tracks, meaning that, e.g. two different kinds of exposure masks need to be employed in photolithographic circuit board production.

In any case, the problem remains of having to handle two different variants of the circuitry in series production, as a result of which the objective of minimizing the variants of the components employed and the complexity in handling fails to be attained optimally.

Although only one circuit substrate is involved when using circuit substrates having two different layouts for the circuitry applied to both sides (e.g. as in the case of a double-sided circuit board provided with tracks on both sides or a double-sided flexible circuit film printed on both sides) this still needs to be provided with tracks on both sides which, depending on the method employed in each case, may considerably add to the complexity in production and thus the costs involved.

SUMMARY OF THE INVENTION

It is thus the objective of the present invention to propose a circuit substrate assembly comprising a left-hand and a right-hand circuit substrate including electrical and/or electronic and/or electromechanical components positioned mirror-symmetrical to each other in which the number of component variants needing to be made available for series production including the number of variants of the circuitry for the left-hand and right-hand circuit substrate is a minimum.

This objective is achieved by the means as provided for in claim 1. The dependent claims relate to advantageous embodiments of the present invention.

In addition to the series production of circuit substrates for electromechanical car door locks, the same problem situation exists in the requirement for circuit substrates symmetrical in three-dimensional geometry as regards component positioning but asymmetrical as regards the circuit functionality of these symmetrically positioned components likewise e.g. in the series production of circuit substrates for left-hand and right-hand car seat adjustment, in the series production of vehicles having left-hand or right-hand drive or quite generally in any situation where a left-hand variant and a right-hand variant mirror-symmetrical thereto as regards the three-dimensional geometry of a circuit substrate needs to be produced in making use of but a single type of electrical and/or electronic components.

BRIEF DESCRIPTION OF THE DRAWINGS

The advantages and features of the present invention will now be detained by way of example embodiments as described in the following with reference to the drawings in which FIG. 1a is a plan view of the left-hand variant of circuit substrate in accordance with the invention including the circuitry integrated therein;

FIG. 1b is a plan view of a right-hand circuit substrate corresponding to the left-hand circuit substrate as shown in FIG. 1a;

FIGS. 2a and 2b are plan views of a left-hand and right-hand variant respectively of the circuitry as shown in FIGS. 1a and 1b respectively each in the form of a stamped matrix.

FIG. 4 is a diagrammatic illustration of a circuit diagram and a plug contact assignment of a plug for the left-hand and right-hand variant respectively of a circuit substrate as shown in FIGS. 3a and 3b;

FIGS. 5a and 5b are plan views of a left-hand and right-hand variant of conventional circuitry in the form of stamped matrixes for use in the circuit substrates as shown in FIGS. 3a and 3b respectively;

FIGS. 6a and 6b are views corresponding to those as shown in FIGS. 3a and 3b showing the circuitry integrated in the two circuit substrates as shown in FIGS. 5a and 5b;

FIG. 7 is a plan view of a plug used preferably on a circuit substrate assembly in accordance with the invention including two rows of terminals arranged juxtaposed in parallel.

DETAILED DESCRIPTION OF THE INVENTION

Figure 3A:
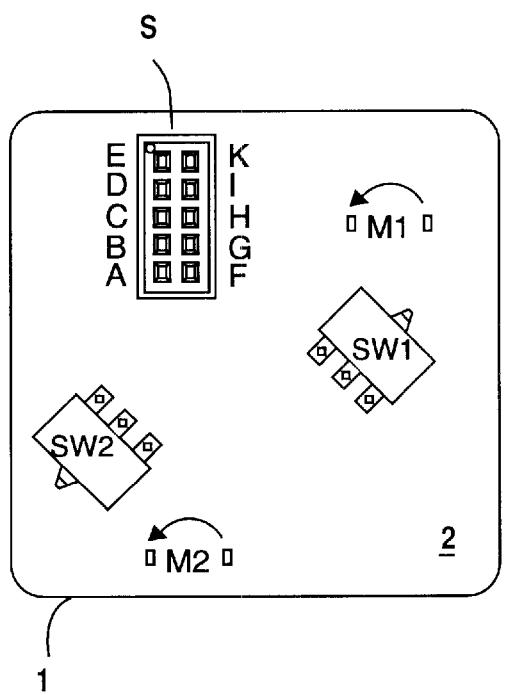
FIGS. 3a and 3b are plan views of a left-hand and right-hand variant respectively of a circuit substrate to assist explaining the objective forming the basis of the invention as well as the components applied thereo, the assigned circuitry being concealed.

Referring now to FIGS. 1a and 1b there is illustrated a circuit substrate assembly in accordance with the invention comprising a left-hand 2 and a right-hand circuit substrate 2' arranged mirror-symmetrical thereto as regards its three-dimensional geometry along a mirror plane P. Electrical and/or electronic and/or electromechanical components such as switches SW1 or SW1', SW2 or SW2'. electric motors M1 or M1', M22 or M2' and contact plugs S or S' are positioned in a pan 1, 1' on the embedded stamped matrix in the circuit substrates 2, 2', all electrically in contact with the stamped matrix.

In the left-hand and right-hand variant of the circuit substrate 2, 2' these components are positioned and oriented mirror-symmetrical to the mirror plane P.

It is to be noted, however, that precisely the same components are used in each case in the left-hand and right-hand circuit substrate. The switch SW1 on the left-hand circuit substrate is thus identical to the switch SW1' on the right-hand circuit substrate, switch SW2 on the left-hand circuit substrate is thus identical to the switch SW2' on the right-hand circuit substrate, the same applying to the electric motors M1 or M1' as well as M2 or M2', each of which turns in the left-hand and right-hand variant of the circuit substrates 2, 2' in the same direction of rotation (counter-clockwise) and not contrary to each other. Furthermore, the contact assignments A to K or A' to K' of the plugs S and S' respectively are not applied mirror-symmetrical to each other. Instead, the plug S' on the right-hand circuit substrate 2' can be imagined to materialize from the plug S on the left-hand circuit substrates 2, such that the plug S as shown in FIG. 1a is shifted to the right about the arrow a by a translational shift perpendicular to the mirror plane P.

The left-hand circuit substrate 2 as shown in FIG. 1a and the right-hand circuit substrates 2' as shown in FIG. 1b are thus mirror-symmetrical as regards a three-dimensional geometry, but due to the motors rotating in the same sense and due to precisely the same contact assignments A to K on the two circuit substrates are asymmetrical to each other in circuit functioning.

The two circuit substrates 2, 2' as shown in FIGS. 1a and 1b comprise circuitry 3 or 3' in the form of electrically conducting stamped matrixes as evident from FIGS. 2a and 2b, whereby precisely identical stamped matrixes are inserted in both circuit substrates 2, 2'. The stamped matrix inserted in the right-hand circuit substrates 2 thus materializes from the stamped matrix used in the left-hand circuit substrate by mirroring at the mirror plane P.

This thus enables resort to be made to a single type of stamped matrix which when used in the left-hand circuit substrate is componented on a predefined side and when used in the right-hand circuit substrate is componented on the opposite side for good material economy.

Where a metallic stamped matrix is concerned in which the matrix sections are totally electrically conducting and can thus be electrically contacted, this is done by soldering or bonding or welding the contact pins or contact tags of the components to one side of a stamped matrix or respectively to the opposite side. By making use of two stamped matrixes symmetrical to each other only one stamping die needs to be made available.

Referring now to FIGS. 2a and 2b the black circles 9 and 9' respectively identify positions at which the the terminal contacts of the components as shown in FIGS. 1a and 1b (plugs S or S', motors M1, M2 or M1', M2' and switches S1, S2 or S1', S2') are connected to the stamped matrixes. Preferably the left-hand and right-hand variants of the stamped matrix are each provided at these points 9, 9' with contact pins or contact tags by a step in production to be implemented separate for both variants, as achievable by the usual methods of welding, soldering or in principle also by bonding contact pins or contact tags. The contacts of the components can then be connected to the prefabricated stamped matrixes by particularly simple ways and means.

Due to using identical plugs S or S' and motors in series production of car door locks particular attention is to be paid to the requirement of functional asymmetry as regards the plugs and motors mounted on the left-hand and right-hand circuit substrates respectively.

To minimize problems in configuring the layout of the circuitry for a circuit substrate assembly in accordance with the invention the array for the contact terminals of a plug S or S' as shown in FIG. 7 and the contacting sections of the circuitry for a circuit substrate assembly in accordance with the invention is preferably selected: As evident from FIG. 7 a plug S is provided with plug contacts A to K arranged in two rows juxtaposed in parallel, i.e. a first row of plug contacts A to E and a second row of plug contacts F to K. The contact terminals a to e assigned to the first row of plug contacts A to E are arranged offset by a distance x relative to the second row of contact terminals f to k assigned to the plug contacts F to K.

Now, in defining a layout for a circuitry to be employed in a circuit substrate assembly in accordance with the invention the circuitry sections 10 and 11, 12 and 13, 13 and 14 (FIG. 2a) corresponding to the plug contacts A and F, B and G, C and H are likewise arranged in two rows juxtaposed in parallel to each other, as evident from FIGS. 1a and 1b respectively, i.e. so that below a pair of plug contacts A and F, B and G, C and H two circuitry sections each run parallel to each other. By arranging the circuitry sections in this way, it is assured that the left-hand variant, in which the plug S contacts the stamped matrix at a first side, as well as in the right-hand variant "flipped" relative thereto in which the corresponding plug S' contacts the opposite side, as provided for in the circuit diagram (FIG. 4) can be connected. In the present example in accordance with the circuit diagram as shown in FIG. 4 the plug contacts D and I, E and K are not contacted.

This arrangement ensures that all contact terminals a, b, c, f, g, h of the plug contacts A to C as well as F to H of the plug to be contacted are able to enter into contact with the circuitry sections 10 to 15 (FIG. 2a) on the circuitry 3, 3' on both the left-hand circuit substrate 2, as shown in FIG. 2a as well as on the circuit substrate 2', flipped 180° thereto as shown in FIG. 2b (i.e. mirrored at the mirror plane P), in other words the right-hand circuit substrate 2'.

Figure 8B:
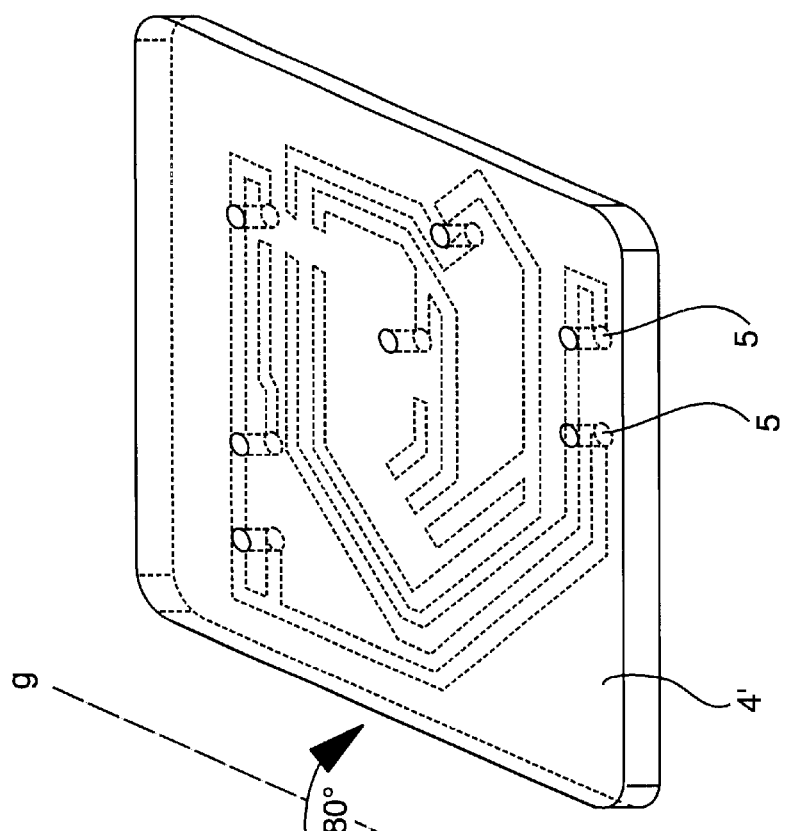
FIGS. 8a and 8b are views in perspective of left-hand and right-hand variants of a single-sided conductor substrate for use in the circuit substrate assembly in accordance with the invention in the form of a rigid circuit board or a flexible circuit film with a plated-through track plane.

Instead of a stamped matrix, which when used in a right-hand circuit substrate instead of in a left-hand circuit substrate is to be mirrored at a mirror plane and to be directly contacted with components double-sided, it is now possible in a circuit substrate assembly in accordance with the invention to use rigid circuit boards or flexible circuit films provided with tracks only on one side. This is evident from FIGS. 8a and 8b, illustrating in perspective two identical circuitry substrates 4, 4' provided single-sided with tracks in a circuit substrate assembly in accordance with the invention oriented for use in a left-hand and a right-hand circuit substrate.

Figure 8A:
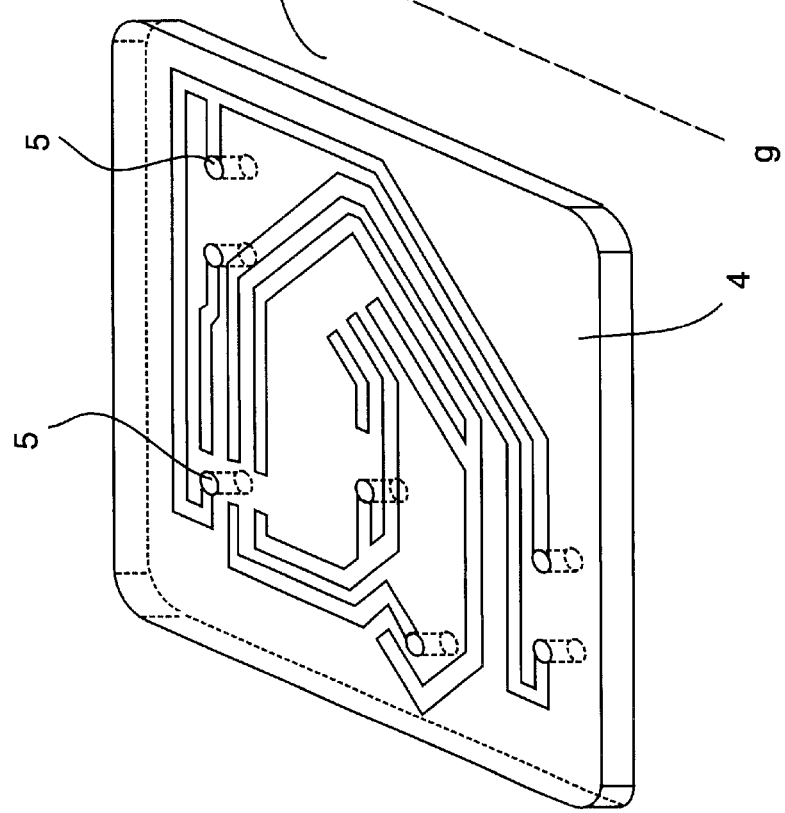

Shown in FIG. 8a is a conductor substrate 4 provided single-sided with tracks for use in a left-hand circuit substrate. Shown in in FIG. 8b is a conductor substrate totally identical to the conductor substrate as shown in FIG. 8a for use in a right-hand circuit substrate. The conductor substrate as shown in FIG. 8b can be imagined as the conductor substrate as shown in FIG. 8a flipped 180° longitudinally about the axis shown between the two conductor substrates.

The conductor substrate 4, 4' is provided with through-holes 5 on its tracks where components are to be applied, the through-holes 5 being through-plated for this purpose, thus making it possible to component the conductor substrate 4 double-sided, although provided only single-sided with tracks. This thus enables conductor substrates provided only single-sided with tracks to be employed for both left-hand and right-hand circuit substrate variants in a circuit substrate assembly in accordance with the invention.

I claim:

1. A circuit substrate assembly comprising a left hand and a right hand circuit substrate identical thereto, each including electrical and/or electronic and/or electromechanical components and circuitry electrically connecting said components, whereby said components are positioned symmetrically mirrored on said left-hand and said right-hand circuit substrate respectively when said left-hand and said right-hand circuit substrate are oriented along a mirror plane wherein the circuit functional contact assignments of at least one circuit functional mirror-invariant component on said right-hand circuit substrate materialize by a translational shift perpendicular to said mirror plane from said circuit functional contact assignments of said corresponding circuit functional mirror-invariant component on said left-hand circuit substrate, and the circuitry on said left-hand circuit substrate can be translated into the circuitry on said right-hand circuit substrate by flipping it 180° about an axis of rotation located in said mirror plane, and wherein said at least one circuit functional mirror-invariant component is a plug including plug contacts arranged in two rows juxtaposed in parallel, the contact terminals of said first row of plug contacts is arranged offset relative to said contact terminals of said second row of plug contacts by a distance parallel to the longitudinal axis of said plug, and circuitry sections corresponding to said plug contacts are likewise arranged in two rows juxtaposed in parallel so that one pair each of said circuitry sections runs under one pair each of plug contacts.

2. The circuit substrate assembly as set forth in claim 1 wherein said components on said left-hand circuit substrate are applied to one side of a first stamped matrix and said components on said right-hand circuit substrate are applied to the opposite side of a second stamped matrix identical to said first stamped matrix.

3. The circuit substrate assembly as set forth in claim 2 wherein said components on said left-hand circuit substrate are applied to said side of a conductor substrate provided single-sided with tracks, and said electromechanical components on said right-hand circuit substrate are applied to the other side of a second conductor substrate identical to said first conductor substrate and electrically connected to said tracks by through-holes through said conductor substrate.

4. The circuit substrate assembly as set forth in claim 3 wherein said conductor substrate is a rigid circuit board.

5. The circuit substrate assembly as set forth in claim 3 wherein said conductor substrate is a flexible circuit board.

6. The circuit substrate assembly as set forth in claim 3 wherein said conductor substrate is a flexible circuit film.

7. The circuit substrate assembly as set forth in claim 2 wherein contact pins and/or contact tags are each applied to said first stamped matrix and to said second stamped matrix so that they permit contacting said circuit functional mirror-invariant components on said left-hand circuit substrate (first stamped matrix) and on said right-hand circuit substrate (second stamped matrix).

8. The circuit substrate assembly as set forth in claim 1 wherein said components on said left-hand circuit substrate are applied to said side of a conductor substrate provided single-sided with tracks, and said electromechanical components on said right-hand circuit substrate are applied to the other side of a second conductor substrate identical to said first conductor substrate and electrically connected to said tracks by through-holes through said conductor substrate.

9. The circuit substrate assembly as set forth in claim 8 wherein said conductor substrate is a rigid circuit board.

10. The circuit substrate assembly as set forth in claim 8 wherein said conductor substrate is a flexible circuit board.

11. The circuit substrate assembly as set forth in claim 8 wherein said conductor substrate is a flexible circuit film.

* * * * *

UNITED STATES PATENT AND TRADEMARK OFFICE
CERTIFICATE OF CORRECTION

PATENT NO. : 6,625,038 B2
DATED : September 23, 2003
INVENTOR(S) : Raschke

It is certified that error appears in the above-identified patent and that said Letters Patent is hereby corrected as shown below:

Column 2,
Lines 9-10, change "and the plug positions plug positions A-K" to -- and the plug position A-K --
Line 67, change "in the form of of" to -- in the form of --

Column 3,
Line 54, change "be detained by" to -- be detailed by --
Line 67, change "matrix," to -- matrix; --

Figure 3B:
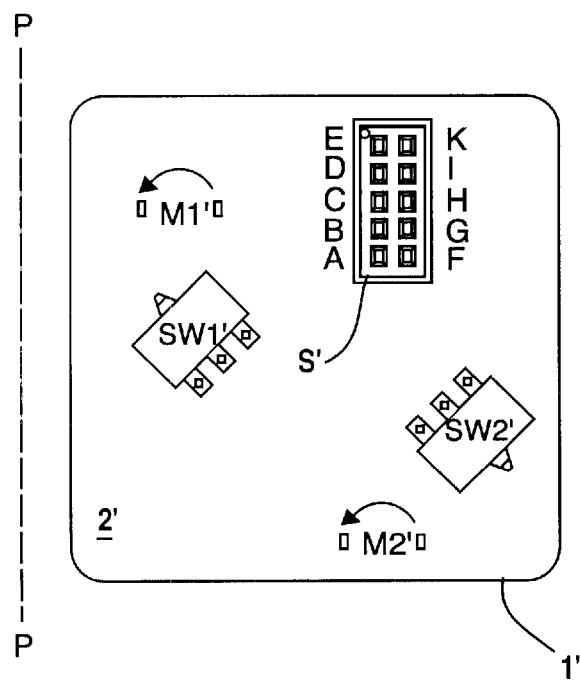

Column 4,
Line 4, change "applied thereo, the assigned" to -- applied thereto, the assigned --
Line 5, change "circuitry being concealed:" to -- circuitry being concealed; --
Line 9, change "shown in FIGS. 3a and 3b:" to -- shown in FIGS. 3a and 3b; --
Line 37, change "SW2'. electric motors" to -- SW2'. Electric motors --
Line 38, change "M1', M22 or M2'" to -- M1', M2 or M2' --

Column 6,
Line 28, change "Shown in in FIG. 8b" to -- Shown in FIG. 8b --

Signed and Sealed this

Fifth Day of April, 2005

JON W. DUDAS
*Director of the United States Patent and Trademark Office*